(12) United States Patent
Nakamura et al.

(10) Patent No.: US 10,166,939 B2
(45) Date of Patent: Jan. 1, 2019

(54) VEHICULAR POWER SUPPLY CONTROL DEVICE AND A CONTROLLING METHOD OF THE SAME

(71) Applicant: YAZAKI CORPORATION, Tokyo (JP)

(72) Inventors: Yoshihide Nakamura, Shizuoka (JP); Keisuke Ueta, Shizuoka (JP); Yoshinori Ikuta, Shizuoka (JP); Yasuyuki Shigezane, Shizuoka (JP); Shuuji Satake, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 15/469,631

(22) Filed: Mar. 27, 2017

(65) Prior Publication Data

US 2017/0197566 A1 Jul. 13, 2017

Related U.S. Application Data

(63) Continuation of application No. PCT/JP2015/080399, filed on Oct. 28, 2015.

(30) Foreign Application Priority Data

Oct. 30, 2014 (JP) .................. 2014-221215
Apr. 27, 2015 (JP) .................. 2015-090352

(51) Int. Cl.
*B60R 16/03* (2006.01)
*G01K 7/16* (2006.01)
(Continued)

(52) U.S. Cl.
CPC .............. *B60R 16/03* (2013.01); *G01K 7/16* (2013.01); *G01K 7/42* (2013.01); *G01R 31/02* (2013.01);
(Continued)

(58) Field of Classification Search
CPC ........ B60R 16/03; B60R 16/033; G01K 7/16; G01K 2205/00; H02M 1/32; H02H 5/04;
(Continued)

(56) References Cited

U.S. PATENT DOCUMENTS 5,786,973 A 7/1998 Majumdar et al.
6,417,652 B1 7/2002 Kabune et al.
(Continued)

FOREIGN PATENT DOCUMENTS

CN 103250317 A 8/2013
CN 103260958 A 8/2013
(Continued)

OTHER PUBLICATIONS

The Official Action dated Jun. 6, 2017 in the counterpart Japanese patent application.
(Continued)

*Primary Examiner* — Gustavo Rosario Benitez
(74) *Attorney, Agent, or Firm* — Metrolexis Law Group, PLLC

(57) ABSTRACT

When supplying electric power to a load from a power supply via a parallel circuit of two electrical wires having the same wiring resistance, a vehicular power supply control device uses a current measurement unit in intelligent power devices (IPDs) to measure a passing current flowing in a semiconductor switching device in each of the electrical wires. Then, in order to match the temperatures of the electrical wires as estimated by a present temperature estimation unit base on the measured current, a target duty ratio in a PWM control for reducing the passing current in the semiconductor switching device of the IPD on one electrical wire is calculated in a target duty ratio calculation unit, and the semiconductor switching device of the one IPD is turned (Continued)

on and off by a PWM/DC control and shutoff determination unit with the calculated target duty ratio.

7 Claims, 9 Drawing Sheets

(51) Int. Cl.
| | |
|---|---|
| *H02H 5/04* | (2006.01) |
| *G01R 31/02* | (2006.01) |
| *H02H 6/00* | (2006.01) |
| *G01K 7/42* | (2006.01) |
| *H02H 7/22* | (2006.01) |
| *H02J 1/06* | (2006.01) |
| *H02J 7/00* | (2006.01) |
| *H02M 1/32* | (2007.01) |

(52) U.S. Cl.
CPC ............... *H02H 5/04* (2013.01); *H02H 6/00* (2013.01); *H02H 7/226* (2013.01); *H02J 1/06* (2013.01); *H02J 7/0065* (2013.01); *G01K 2205/00* (2013.01); *G01K 2217/00* (2013.01); *H02H 5/041* (2013.01); *H02M 1/32* (2013.01)

(58) Field of Classification Search
CPC .......... H02H 5/041; H02H 1/06; H02H 3/085; H02H 7/226; H02H 7/228; H02H 9/025; H02P 27/08; G06F 1/26
See application file for complete search history.

(56) References Cited

U.S. PATENT DOCUMENTS

| | | | |
|---|---|---|---|
| 7,671,571 B2* | 3/2010 | Burlak ..................... | H02M 1/32 |
| | | | 323/275 |
| 8,405,946 B2 | 3/2013 | Higuchi et al. | |
| 8,767,367 B2 | 7/2014 | Higuchi et al. | |
| 9,083,179 B2 | 7/2015 | Ikuta et al. | |
| 2002/0021113 A1 | 2/2002 | Kabune et al. | |
| 2009/0183760 A1* | 7/2009 | Meyer ............... | H01L 31/02008 |
| | | | 136/244 |
| 2010/0014195 A1* | 1/2010 | Takahashi .......... | H03K 17/0822 |
| | | | 361/18 |
| 2010/0254059 A1 | 10/2010 | Higuchi et al. | |
| 2011/0032001 A1* | 2/2011 | Hasegawa .............. | G01K 3/005 |
| | | | 327/1 |
| 2011/0080681 A1* | 4/2011 | Maruyama ............. | H02H 6/005 |
| | | | 361/93.8 |
| 2011/0215653 A1 | 9/2011 | Anjima et al. | |
| 2011/0298528 A1* | 12/2011 | Endo ................... | H03K 17/6871 |
| | | | 327/512 |
| 2012/0068721 A1 | 3/2012 | Moon et al. | |
| 2012/0081825 A1* | 4/2012 | Nakamura ............. | H02H 3/087 |
| | | | 361/93.8 |
| 2013/0070933 A1 | 3/2013 | Itou | |
| 2013/0163138 A1 | 6/2013 | Higuchi et al. | |
| 2013/0249696 A1 | 9/2013 | Ikuta et al. | |
| 2013/0250463 A1* | 9/2013 | Ueta ....................... | H02H 7/18 |
| | | | 361/87 |
| 2013/0253722 A1* | 9/2013 | Nakamura .......... | B60R 16/0232 |
| | | | 700/295 |
| 2015/0163871 A1 | 6/2015 | Takeshi et al. | |

FOREIGN PATENT DOCUMENTS

| | | |
|---|---|---|
| CN | 103262374 A | 8/2013 |
| JP | H06-48246 A | 2/1994 |
| JP | H09-129821 A | 5/1997 |
| JP | H11-252785 A | 9/1999 |
| JP | 2001-310720 A | 11/2001 |
| JP | 2002-185295 A | 6/2002 |
| JP | 2004-294404 A | 10/2004 |
| JP | 2005-295738 A | 10/2005 |
| JP | 2008-002835 A | 1/2008 |
| JP | 2009-021071 A | 1/2009 |
| JP | 2009-130944 A | 6/2009 |
| JP | 2011-178320 A | 9/2011 |
| JP | 2012-065529 A | 3/2012 |
| JP | 2012-122869 A | 6/2012 |
| JP | 2013-064656 A | 4/2013 |
| JP | 2013-085469 A | 5/2013 |
| JP | 2015-110357 A | 6/2015 |
| JP | 2015-194414 A | 11/2015 |

OTHER PUBLICATIONS

Written Opinion of the International Searching Authority (Form PCT/ISA/237) dated Jan. 19, 2016 in PCT International application PCT/JP2015/080399 (English translation of the Written Opinion will be issued and uploaded to Patentscope of WIPO.).
The Chinese office action dated Jun. 29, 2018 in a counterpart Chinese Patent application.

* cited by examiner

FIG. 11A INPUT SIGNAL
FIG. 11B SHUTOFF STATE
FIG. 11C OUTPUT
FIG. 11D DISCONNECTION STATE
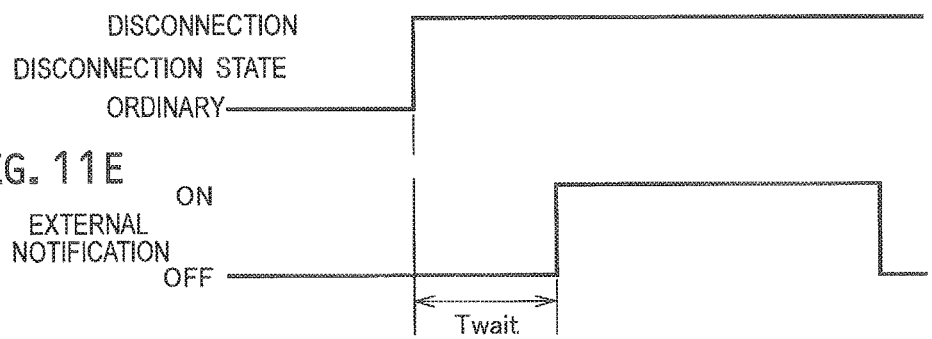
FIG. 11E EXTERNAL NOTIFICATION
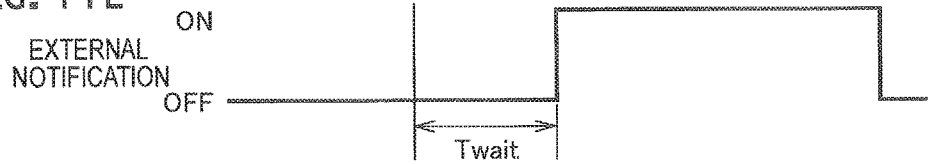
FIG. 12
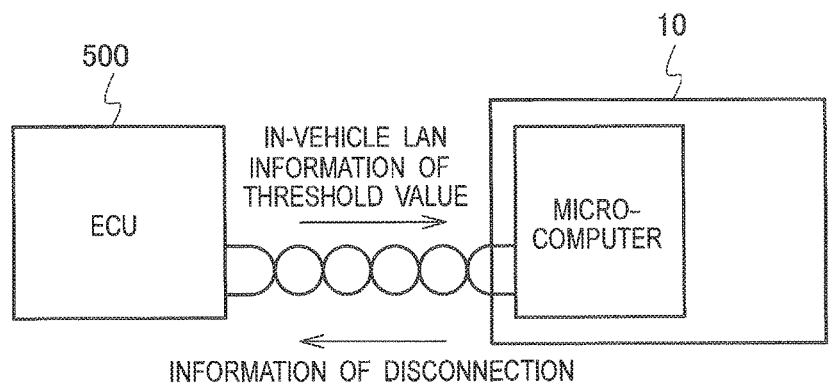

VEHICULAR POWER SUPPLY CONTROL DEVICE AND A CONTROLLING METHOD OF THE SAME

CROSS REFERENCE TO RELATED APPLICATIONS

This application is a continuation of International Application No. PCT/JP2015/080399, filed Oct. 28, 2015, and based upon and claims the benefit of priority from Japanese Patent Applications No. 2014-221215, filed Oct. 30, 2014, and No. 2015-090352, filed Apr. 27, 2015, the entire contents of all of which are incorporated herein by reference.

TECHNICAL FIELD

The present application relates to a vehicular power supply control device that performs supplying and shutting off electric power to a load by turning on and off a semiconductor switching device on an electrical wire for supplying the electric power from a power supply to the load based on a temperature of the electrical wire, and relates a controlling method of the vehicular power supply control device.

BACKGROUND

In a vehicle, conventionally, controlling of supplying electric power from a power supply to a load has been achieved by turning on and off a semiconductor switching device. In some methods of such controlling, it is employed, as the semiconductor switching device, an intelligent power device (IPD) with a passing current detecting function, a self-protective function against an overcurrent, and the like.

When using such an IPD as the semiconductor switching device, for example, it becomes possible to construct a power supply control device so that a temperature of an electrical wire connecting a power supply with a load is estimated from a passing current detected by the passing current detecting function of the IPD, and further, when the so-estimated temperature exceeds a predetermined maximum temperature, supplying electric power to the load is shut down by turning off the semiconductor switching device in view of protecting the electrical wire (see JP 2009430944 A). Additionally, for example, in a situation where it is impossible to provide for a current sufficient for driving a load by the current-carrying ability of a single IPD, it has been proposed to interpose a plurality of IPDs having the same specification, which are connected in parallel, between a power supply and the load. In this proposal, it is carried out to make the magnitude of currents passing through respective IPDs identical to each other by matching all wiring resistances of respective wiring patterns via the IPDs, thereby preventing a current from flowing in a specific IPD concentratively (see JP 2001-310720 A).

SUMMARY

However, there exist variations among individuals in the ON resistance of semiconductor switching devices of the IPDs and the circuit resistance of internal circuits. Thus, even though a current of the same magnitude flows through each IPD actually, a variation among individuals may occur in the passing currents detected by the respective IPDs.

When the passing currents detected by the respective IPDs are different from each other, a variation also arises in the temperatures of the electrical wires estimated from the passing currents. As a result, there is a possibility that shut down operation of each IPD for supplying the electric power becomes unstable despite that the actual currents flowing in the respective IPDs and the wiring resistances of wiring patters via the IPDs are identical to each other.

When such a phenomenon occurs, there is a possibility that even after supplying the electric power is shut down by one IPD, the other IPD operates to maintain supplying the electric power, thereby causing anomaly heat generation or resistance deterioration due to a concentration of current on the other IPD still maintaining supplying the electric power.

In consideration of the above-mentioned situation, assuming that power to be supplied from a vehicular power supply to a load through a parallel circuit of a plurality of electrical wires is shut off by turning off semiconductor switching devices on the respective electrical wires based on temperatures of the electrical wires, an object of the present application is to provide a vehicular power supply control device which is capable of synchronizing power-supplying shutoff timings by the respective semiconductor switching devices even when there is a variation among individuals in the respective semiconductor switching devices or the respective electrical wires are different from each other in terms of their installation environment.

In order to achieve the above object, according to an aspect of the present application, there is provided a vehicular power supply control device for shutting off electric power to be supplied from a vehicular power supply to a load via a parallel circuit of a plurality of electrical wires by turning off respective semiconductor switching devices on the electrical wires based on respective temperatures of the electrical wires, the vehicular power supply control device includes: a current measurement unit configured to measure passing currents each flowing through each of the semiconductor switching devices; a wire temperature estimation unit configured to estimate a temperature of each of the electrical wires from the passing currents measured by the current measurement unit; a duty ratio determination unit configured to determine a duty ratio of PWM control of each of the semiconductor switching devices in order to match respective estimated temperatures of the electrical wires; and a PWM control unit configured to PWM-control each of the semiconductor switching devices with the duty ratio determined corresponding to each of the semiconductor switching devices by the duty ratio determination unit.

With the vehicular power supply control device according to the aspect of the present application, the temperatures of the respective electrical wires are estimated from the passing currents of the respective semiconductor switching devices measured by the current measurement unit and successively, the duty ratios of PWM control of the semiconductor switching devices on the respective electrical wires are determined in order to match the estimated temperatures of the respective electrical wires.

For this reason, for an electrical wire that a target temperature to be matched is lower than the temperature estimated from the passing current of the relevant semiconductor switching device, the duty ratio of PWM control for making the estimated temperature coincide with the target temperature lower than the estimated temperature has the contents of reducing its on-duty.

Conversely, for an electrical wire that the target temperature to be matched is higher than the temperature estimated from the passing current of the relevant semiconductor switching device, the duty ratio of PWM control for making the estimated temperature coincide with the target temperature higher than the estimated temperature has the contents of increasing its on-duty.

In either case, by PWM-controlling the semiconductor switching devices at the duty ratios corresponding to the temperatures of the electrical wires estimated from the measurement values of the passing currents of the respective semiconductor switching devices, subsequently-estimated temperatures of the respective electrical wires come to be matched with each other, thereby allowing the coincidence of timings at which the respective semiconductor switching devices are turned off based on the temperatures of the electrical wires.

Therefore, when shutting off the electric power supplied from the vehicular power supply to the load via the parallel circuit of the plurality of electrical wires by turning off the semiconductor switching devices on the respective electrical wires based on the temperatures of the respective electrical wires, the shutoff timings of power supply by the respective semiconductor switching devices can be synchronized with each other even when there is a variation among individuals in the respective semiconductor switching devices or the respective electrical wires are different from each other in terms of their installation environment.

The duty ratio determination unit is configured to determine the duty ratio of PWM control of each of the semiconductor switching devices so as to make the estimated temperature of each of the electrical wires coincide with the lowest one of the estimated temperatures.

With such a configuration, the duty ratios of PWM control of the semiconductor switching devices are determined so as to make the temperatures of the respective electrical wires, which are estimated from the passing currents of the semiconductor switching devices measured by the current measurement unit, coincide with the lowest one of the estimated temperatures.

For this reason, for the electrical wires whose temperatures estimated from the passing currents of the relevant semiconductor switching devices are different from the lowest estimated temperature, the duty ratios of PWM control are determined so as to uniformly reduce their on-duty so that the passing current of each semiconductor switching device decreases to cause the temperature estimated from the passing current to be lowered.

Thus, by PWM-controlling the target semiconductor switching devices at the duty ratio corresponding to the correction content for matching the estimated temperatures of the respective electrical wires, the temperatures of the electrical wires connected to the target semiconductor switching device(s) are shifted down, so that it is possible to control the temperatures of the respective electrical wires of the parallel circuit to an appropriate temperature.

With the vehicular power supply control device according to the aspect of the present application, when shutting off the power supplied from the vehicular power supply to the load via the parallel circuit of the plurality of electrical wires by turning off the semiconductor switching devices on the respective electrical wires based on the temperatures of the respective electrical wires, the shutoff timings of power supply by the respective semiconductor switching devices can be synchronized with each other even when there is a variation among individuals in the respective semiconductor switching devices or the respective electrical wires are different from each other in terms of their installation environment.

BRIEF DESCRIPTION OF DRAWINGS

FIGS. 11A to 11E are timing charts at the time of detecting a disconnection in the disconnection detecting device according to the second embodiment.

FIG. 12 is an explanatory diagram illustrating an example of receiving a threshold value from the outside in the disconnection detecting device according to the second embodiment.

DESCRIPTION OF EMBODIMENTS

First Embodiment

Figure 1:
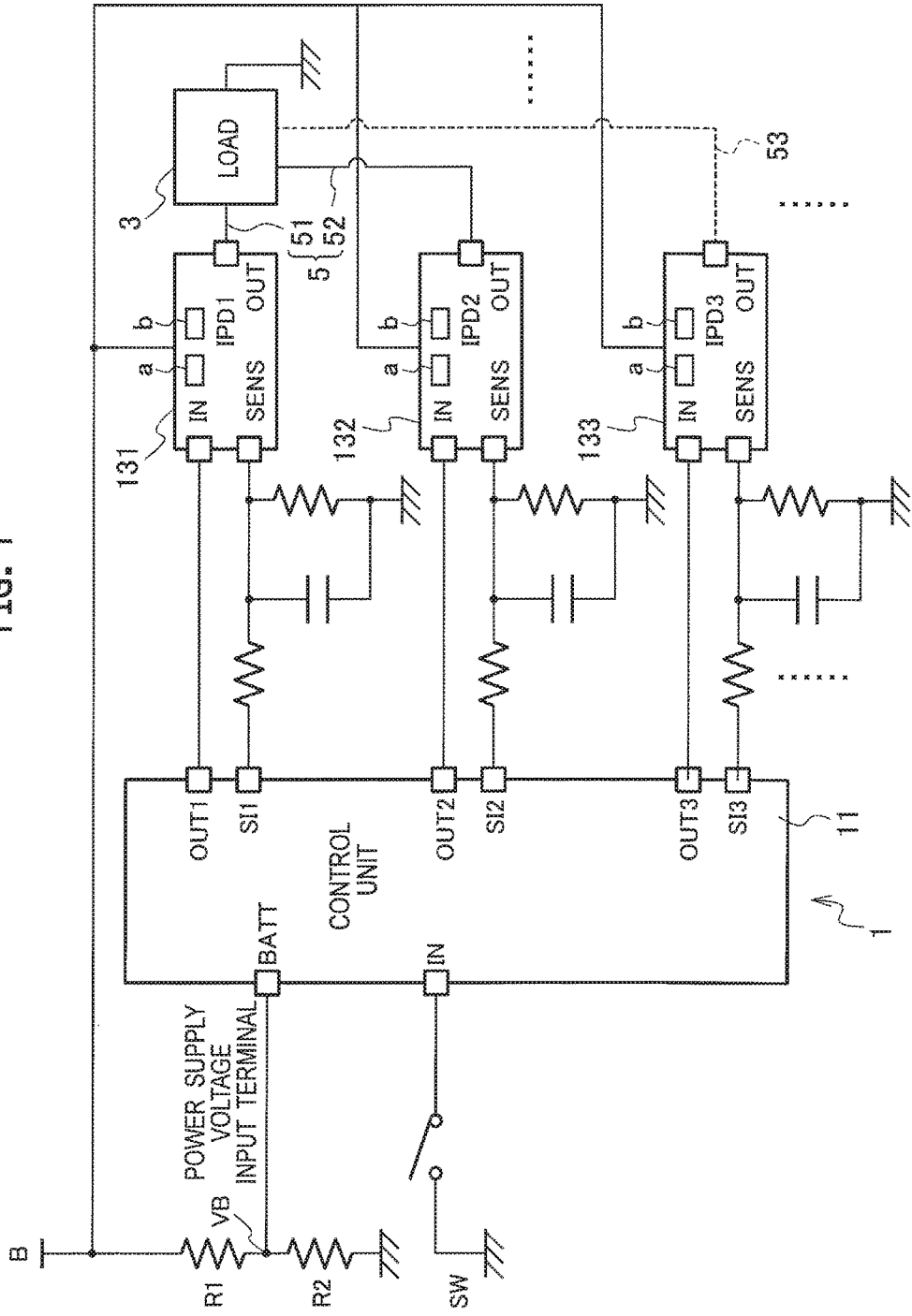
FIG. 1 is a circuit diagram illustrating a fundamental constitution of a vehicular power supply control device according to a first embodiment.

A vehicular power supply control device according to a first embodiment will be described with reference to FIGS. 1 to 4.

A power supply control device 1 (vehicular power supply control device) according to the first embodiment is configured so that a control unit 11 controls the operations of intelligent power devices (IPDs) 131, 132, both of which turn on and off supplying electric power from a power supply B mounted on a vehicle (not illustrated) to a load 3 through a parallel circuit 5 composed of two electrical wires 51, 52 having wiring resistances equal to each other, the IPDs 131, 132 being arranged on the electrical wires 51, 52 respectively. In the first embodiment, it is assumed that the load 3 is an electrical component, for example, a headlight or the like.

Each of the respective intelligent power devices (IPD) 131, 132 incorporates a semiconductor switching device "a" and a current measurement unit "b". Each of the semiconductor switching devices "a" is turned on and off by corresponding driving signal DR1, DR2 that the control unit 11 outputs to the corresponding IPD 131, 132 in response to the on and off operation of an input switch SW. Each of the current measurement units "b" measures a passing current flowing through the corresponding electrical wire 51, 52 through the corresponding semiconductor switching device "a" in an on-state.

The semiconductor switching device "a" of each of the IPDs 131, 132 is turned off under the control of the control unit 11 when the temperature of each of the electrical wires 51, 52, which is estimated by the control unit 11 based on a passing current measured by the current measurement unit "b", rises up to a shutoff temperature established for the corresponding electrical wire 51, 52 (shutoff temperature: e.g. 130° C. lower than the smoke temperature 150° C. of the electrical wires 51, 52).

The control unit 11 is constituted by a microcomputer, a custom IC, or the like, that achieves various kinds of processing by executing a program. The control unit 11 includes an input terminal IN, output terminals OUT1, OUT2, and input terminals SI1, SI2 for detected currents.

The input terminal IN is a terminal for monitoring on and off states of the input switch SW. Inputted to the input terminal IN is a switch signal S which corresponds to the on and off states of the input switch SW.

In principle, when the switch signal S of the input terminal IN is in the on-state, the output terminals OUT1, OUT2 output the driving signals DR1, DR2 for turning on the semiconductor switching devices "a" of the corresponding IPDs 131, 132 through DC driving or PWM driving, respectively. Respectively inputted to the detected current input terminals SI1, SI2 are current detection signals I1, I2 each of which indicates the value of a passing current measured by the current measurement unit "b" of the corresponding IPD 131, 132.

By the driving signals DR1, DR2 outputted from the output terminals OUT1, OUT2, the control unit 11 turns on the semiconductor switching devices "a" of the corresponding IPDs 131, 132 through DC driving or PWM driving.

Further, the control unit 11 estimates temperatures of the respective electrical wires 51, 52 by the current detection signals I1, I2 from the current measurement units "b" of the IPDs 131, 132 inputted to the detected current input terminals SI1, SI2. Then, when the estimated temperatures rise up to the predetermined shutoff temperatures for the electrical wires 51, 52, the control unit 11 forcibly terminates the outputting of the driving signals DR1, DR2 and forcibly turns off the semiconductor switching devices "a" of the corresponding IPDs 131, 132.

Here, in order to estimate the temperatures of the electrical wires 51, 52 from the current detection signals I1, I2, there can be employed, for example, a method described in JP 2013-085469 A.

More specifically, assuming that the resistances per unit length of the respective electrical wires 51, 52 are represented by Ron1, Ron2, and the cycles of sampling (sampling time) the current detection signals I1, I2 at the detected current input terminals SI1, SI2 by the later-mentioned current detection unit 113 (see FIG. 2) of the control unit 11 is represented by $\Delta t$, the calorific values X1, X2 of the respective electrical wires 51, 52 are obtained by the following expression eliminating a branch number, $$X = I^2 \times Ron \times \Delta t.$$

Next, assuming that the heat capacities per unit length of the electrical wires 51, 52 are represented by pseudo heat capacities Cth*1, Cth*2 and the thermal resistances per unit length of the electrical wires 51, 52 are represented by Rth1, Rth2 respectively, the heat radiation amounts Y1, Y2 of the electrical wires 51, 52 are obtained by the following general expression eliminating a branch number, $$Y = Q/\{(Cth^* \times Rth)/\Delta t\}.$$

Then, the temperature change amounts $\Delta T1$, $\Delta T2$ of the respective electrical wires 51, 52 in the current sampling cycle are obtained into the following general expression eliminating a branch number, $$\Delta T = (X - Y)/Cth^*.$$

Further, by adding the obtained temperature change amounts $\Delta T1$, $\Delta T2$ to the estimated temperatures Tp1, Tp2 of the electrical wires 51, 52 obtained in the previous sampling cycle, the estimated temperatures Tn1, Tn2 of the electrical wires 51, 52 in the current sampling cycle are obtained by the following general expression eliminating a branch number, $$Tn = Tp + \Delta T.$$

Additionally, the pseudo heat capacities Cth*1, Cth*2 of the respective electrical wires 51, 52 can be obtained by the following general expression known as an expression for obtaining an electrical wire temperature T2 when passing a current through the electrical wire continuously, $$T2 = T1 + I^2 \times Ron \times Rth\{1 - \exp(-t/(Cth \times Rth))\}.$$

Here, T1 is an ambient temperature of the electrical wire, and t is a time period during which the electric current continues to flow through the electrical wire.

When replacing the heat capacities Cth1, Cth2 of the respective electrical wires 51, 52 obtained by this general formula by the heat capacity Cth in the method described in JP 2013-085469 A, it is possible to obtain the pseudo heat capacities Cth*1, Cth*2 of the respective electrical wires 51, 52 as the pseudo heat capacity Cth* of the electrical wire described in the same publication.

Meanwhile, there exists a variation among individuals in the ON resistance of the semiconductor switching devices "a" of the IPDs 131, 132 and the circuit resistance of internal circuits. Therefore, even between the IPDs 131, 132 where the semiconductor switching devices "a" are turned on under the same condition, a variation may be caused in the passing currents of the electrical wires 51, 52 measured by the current measurement units "b".

When there is such a variation in the passing currents of the electrical wires 51, 52 measured by the current measurement units "b", a variation occurs in the estimated temperatures Tn1, Tn2 of the respective electrical wires 51, 52, which are estimated from the current detection signals I1, I2 by the control unit 11, despite that the currents of the same magnitude flow through the respective electrical wires 51, 52 actually.

Consequently, despite that the currents passing through the electrical wires 51, 52 or their wiring resistances are equal to each other, the control unit 11 may judge that the estimated temperature has risen up to the shutoff temperature in one of the electrical wires 51, 52, while the estimated temperature has not risen up to the shutoff temperature in the other of the electrical wires 51, 52, thereby causing a mismatch between the contents of judgment. As a result, there is a possibility that the shutoff of supplying the electric power resulting from turning off the semiconductor switching devices "a" forcibly is or is not performed depending on the electrical wires 51, 52 despite the same energizing conditions When such a phenomenon occurs, there arises a possibility that even after supplying the electric power has been shut off in one of the IPDs 131, 132, supplying the electric power is still continued in the other of the IPDs 131, 132, so that an electric current concentrates to the electrical wire 51, 52 and the IPD 131, 132 on the side of continuing supplying the electric power, thereby causing anomaly heat generation or resistance deterioration.

Therefore, the control unit 11 compares the estimated temperatures Tn1, Tn2 of the respective electrical wires 51, 52 with each other and performs control to adjust the duty ratios of the driving signals DR1, DR2 of the semiconductor switching devices "a" to be outputted from the output terminals OUT1, OUT2 to the corresponding IPDs 131, 132 so that the mutual estimated temperatures Tn1, Tn2 accord with each other.

That is, based on the comparison of the estimated temperatures Tn1, Tn2 estimated from the passing currents respectively detected by the current measurement units "b" of the IPDs 131, 132, the control unit 11 performs control to adjust the duty rations of the semiconductor switching devices "a" of the corresponding IPDs 131, 132.

Figure 2:
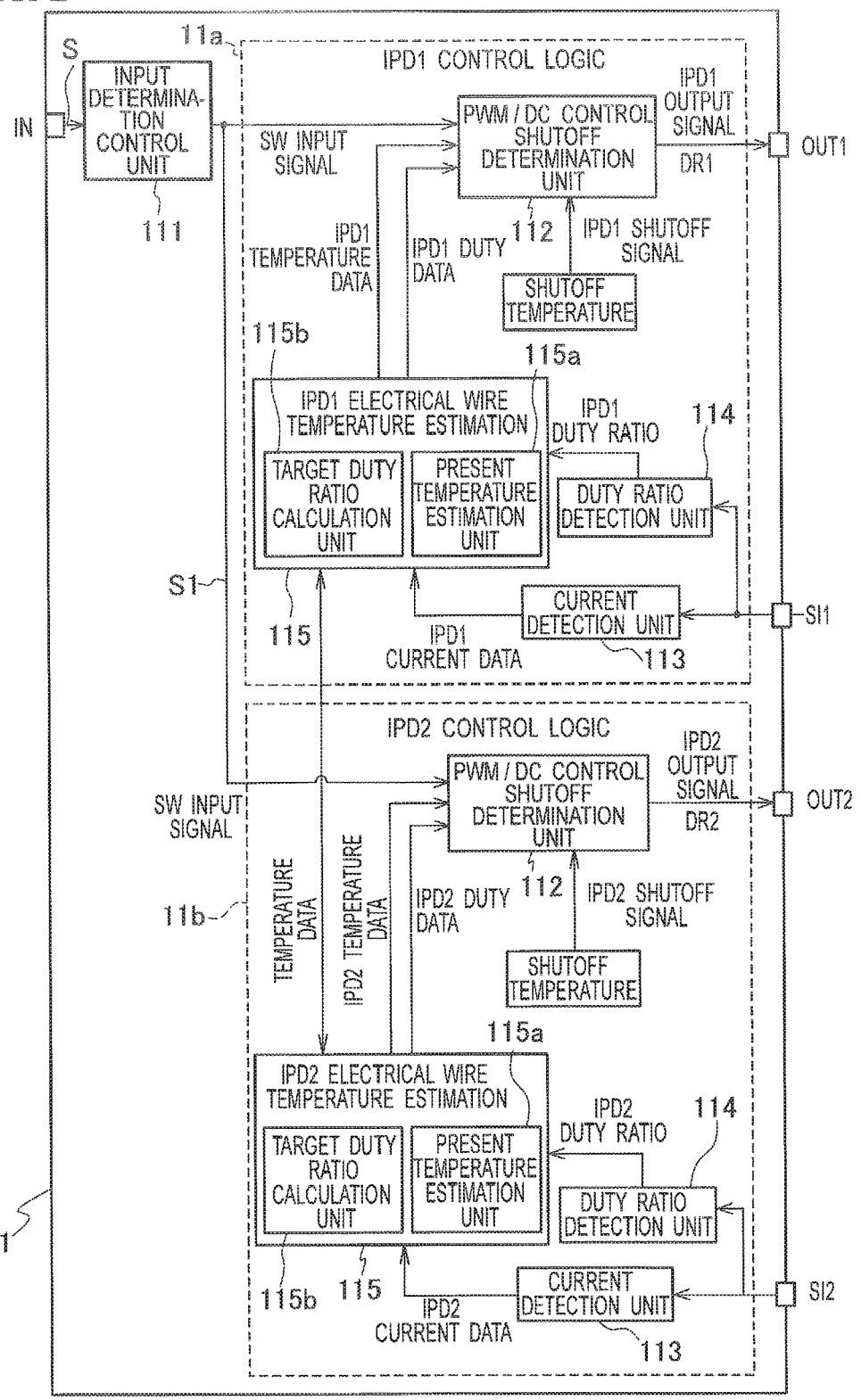
FIG. 2 is a functional block diagram schematically illustrating a process performed in a control unit of FIG. 1.

FIG. 2 is a block diagram schematically illustrating a process executed in the control unit 11. By executing a program stored in a memory (not illustrated), the control unit 11 implements respective functions of an input determination control unit 111 and respective control logics 11a, 11b for the IPDs 131, 132. Each of the control logics 11a, 11b includes respective functions of a PWM/DC control and shutoff determination unit 112, a current detection unit 113, a duty ratio detection unit 114, and a wire temperature estimation unit 115.

The input determination control unit 111 determines the on and off states of the input switch SW based on a switch signal S inputted to the input terminal IN, and outputs an SW input signal S1 when the input switch SW is in an on-state.

In each of the control logics 11a, 11b, the PWM/DC control and shutoff determination unit 112 (PWM control unit) outputs the driving signal DR1, DR2 to the output terminal OUT1, OUT2 while the SW input signal S1 from the input determination control unit 111 is being inputted. In each of the driving signals DR1, DR2, the duty ratio (proportion of the on-duty period in the first embodiment) is set to 100% in case of DC driving and alternatively set less than 100% in case of PWM driving.

Immediately after the input switch SW is turned on, the duty ratio is set to an initial value corresponding to a drive content of the load 3. Thereafter, by the PWM/DC control and shutoff determination unit 112, the initial value is altered to a duty ratio calculated by a later-mentioned target duty ratio calculation unit 115b of the wire temperature estimation unit 115.

From the current detection signals I1, I2 inputted to the detected current input terminals SI1, SI2 respectively, the current detection units 113 and the duty ratio detection unit 114 of the respective control logic 11a, 11b detect the passing currents of the electrical wires 51, 52, which have been detected by the current measurement units "b" in the corresponding IPDs 131, 132, and the duty ratios of the passing currents.

Figure 3:
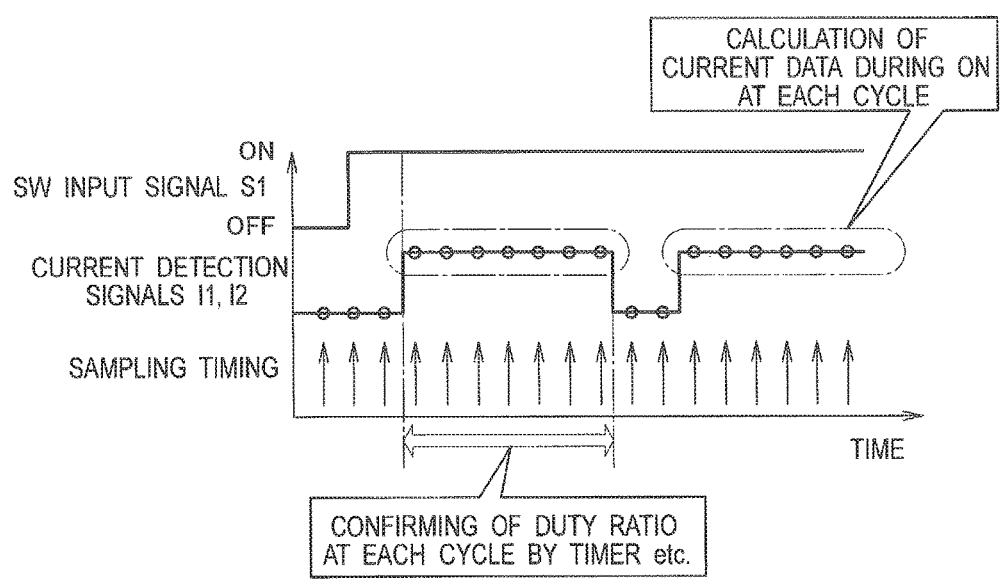
FIG. 3 is a timing chart illustrating a procedure when a current detection unit and a duty ratio detection unit of FIG. 2 detect a passing current of a load and its duty ratio respectively.

FIG. 3 is a timing chart illustrating a procedure when the current detection units 113 and the duty ratio detection units 114 detect the passing currents and the duty ratios of the respective electrical wires 51, 52. When the SW input signal S1 from the input determination control unit 111 illustrated in the upper stage of FIG. 3 is switched from "off" to "on", the load 3 is supplied with the electric power from the power supply B through the IPDs 132, 132 on/off-driven by the driving signals DR1, DR2.

Then, as illustrated in the middle stage of FIG. 3, the current detection signals I1, I2 corresponding to the passing currents of the electrical wires 51, 52 measured by the current measurement units "b" of the IPDs 131, 132 are inputted to the detected current input terminals SI1, SI2. The current detection unit 113 and the duty ratio detection unit 114 sample the current detection signal I1, I2 of the detected current input terminal SI1, SI2 at a sample timing illustrated in the lower stage of FIG. 3.

The current detection unit 113 detects, as the passing current of the electrical wire 51, 52, an average value of respective sampling values in a continuous period (on-period) from the rising edge to the falling edge of the current detection signal I1, I2, levels of which are not zero respectively. From the timings of the rising edge and the falling edge of the current detection signal I1, I2, the duty ratio detection unit 114 specifies the on-period and an off-period of the passing current of each electrical wire 51, 52 in the current detection signal I1, I2 and further detects an on/off-cycle or a duty ratio of the passing current of each electrical wire 51, 52 from the on-period and the off-period specified above.

The duty ratio detection unit 114 may detect the duty ratios of the driving signals DR1, DR2 established by the PWM/DC control and shutoff determination unit 112, as the on/off-duty ratios of the passing currents of the respective electrical wires 51, 52, The wire temperature estimation unit 115 of each control logic 11a, 11b illustrated in FIG. 2 includes a present temperature estimation unit 115a and a target duty ratio calculation unit 115b.

The present temperature estimation unit 115a (wire temperature estimation unit) estimates the temperature of the electrical wire 51, 52 from the passing current (current value indicated by the current detection signal I1, I2) of the electrical wire 51, 52 detected by the current detection unit 113. For this estimation, although there can be employed, for example, the method described in JP 2013-085469 A, outline of which has been explained previously, the other method may be used alternatively.

In order to determine whether or not the temperature of the electrical wire 51, 52 has risen up to the shutoff temperature, the temperature of the electrical wire 51, 52 estimated by the present temperature estimation unit 115a of each control logic 11a, 11b is notified to the PWM/DC control and shutoff determination unit 112 of the same control logic 11a, 11b.

The temperature of the electrical wire 51, 52 estimated by the present temperature estimation unit 115a is notified to the target duty ratio calculation unit 115b of the same wire temperature estimation unit 115 and also notified to the target duty ratio calculation unit 115b of the other control logic 11a, 11b.

Based on the temperature of the electrical wire 51, 52 estimated by the present temperature estimation unit 115a of each control logic 11a, 11b, the target duty ratio calculation unit 115b (duty ratio determination unit) calculates the duty ratio of the driving signal DR1, DR2 of the semiconductor switching device "a" that the PWM/DC control and shutoff determination unit 112 of each control logic 11a, 11b outputs to the corresponding IPD 131, 132.

More specifically, it is performed to calculate the duty ratios of the driving signals DR1, DR2 for making the temperatures of the electrical wires 51, 52, which have been estimated by the present temperature estimation units 115a, coincide with a lower one (minimum temperature) of the temperatures of the electrical wires 51, 52 respectively estimated by the present temperature estimation units 115a of the respective control logics 11a, 11b For example, suppose the load 3 is a valve for a vehicle (rated voltage: 12 V; power consumption: 60 W), and the PWM/DC control and shutoff determination unit 112 of each control logic 11a, 11b drives the semiconductor switching device "a" of the corresponding IPD 131, 132 in DC. In this case, an electric current of 2.5 A flows through each electrical wire 51, 52.

In this state, for example, suppose the current detection unit 113 of the control logic 11a detects that the passing current of the electrical wire 51 measured by the current measurement unit "b" of the IPD 131 is 3.0 A, and based on this detection, the present temperature estimation unit 115a of the wire temperature estimation unit 115 of the control logic 11a estimates that the temperature of the electrical wire 51 is 95° C.

Also suppose the current detection unit 113 of the control logic 11b detects that the passing current of the electrical wire 52 measured by the current measurement unit "b" of the IPD 132 is 2.5 A, and based on this detection, the present temperature estimation unit 115a of the wire temperature estimation unit 115 of the control logic 11b estimates that the temperature of the electrical wire 52 is 90° C.

In this case, the temperature (95° C.) of the electrical wire 51 estimated by the present temperature estimation unit 115a of the control logic 11a is higher than the temperature (90° C.) of the electrical wire 52 estimated by the present temperature estimation unit 115a of the control logic 11b.

Therefore, in order for the present temperature estimation unit 115a of the control logic 11a to estimate the same temperature as the temperature (90° C.) of the electrical wire 52 estimated by the present temperature estimation unit 115a of the control logic 11b as the temperature of the electrical wire 51, the target duty ratio calculation unit 115b calculates the target duty ratio of the driving signal DR1 that the PWM/DC control and shutoff determination unit 112 of the control logic 11a outputs to the output terminal OUT1.

Here, the current (effective current) passing through the electrical wire 51 when turning on and off the semiconductor switching device "a" of the IPD 131 by PWM driving at the target duty ratio will have a value obtained by multiplying the passing current of the electrical wire 51, which has been measured by the current measurement unit "b" of the IPD 131 during the on-period of the semiconductor switching device "a", by the square root of the target duty ratio, that is, the following expression, effective current=passing current of electrical wire 51 measured by current measurement unit "b" of IPD 131×(target duty ratio)$^{0.5}$.

When this effective current coincides with 2.5 A that the current measurement unit "b" of the IPD 132 has measured as the passing current of the electrical wire 52 during DC driving of the semiconductor switching device "a", the same temperature as the temperature (90° C.) of the electrical wire 52 will be estimated as the temperature of the electrical wire 51 by the present temperature estimation unit 115a of the control logic 11a.

Therefore, the above expression is as follows:

2.5=3.0×(target duty ratio of driving signal DR1)$^{0.5}$, and consequently, the target duty ratio of the driving signal DR1 is as follows:

(2.5/3.0)$^2$=69.44(%).

On the other hand, the target duty-ratio calculation unit 115b of the control logic 11b calculates "100%" as the duty ratio of the driving signal DR2 outputted to the output terminal OUT2 by the PWM/DC control and shutoff determination unit 112 of the control logic 11b so that the semiconductor switching device "a" of the IPD 132 continues DC driving and thus, the present temperature estimation unit 115 of the control logic 11b estimates, as the temperature of the electrical wire 52, the same temperature (90° C.) as at present.

Thus, the example where the PWM/DC control and shutoff determination unit 112 of each control logic 11a, 11b drives the semiconductor switching device "a" of the corresponding IPD 131, 132 in DC has been described above.

Next, it is described an example where the PWM/DC control and shutoff determination unit 112 of each control logic 11a, 11b PWM-drives the semiconductor switching device "a" of the corresponding IPD 131, 132.

For example, suppose the PWM/DC control and shutoff determination unit 112 of each control logic 11a, 11b is PWM-driving the semiconductor switching device "a" of the corresponding IPD 131, 132 at the duty ratio of 50%. Then, a current of 2.5 A flows through each electrical wire 51, 52 during the on-period of the semiconductor switching device "a" of the IPD 131, 132.

In this state, for example, suppose the current detection unit 113 of the control logic 11a detects that the passing current of the electrical wire 51 measured by the current measurement unit "b" of the IPD 131 during the on-period of the semiconductor switching device "a" is 3.0 A, and based on this detection, the present temperature estimation unit 115a of the wire temperature estimation unit 115 of the control logic 11a estimates that the temperature of the electrical wire 51 is 40° C.

Also suppose the current detection unit 113 of the control logic 11b detects that the passing current of the electrical wire 52 measured by the current measurement unit "b" of the IPD 132 during the on-period of the semiconductor switching device "a" is 2.5 A, and based on this detection, the present temperature estimation unit 115a of the wire temperature estimation unit 115 of the control logic 11b estimates that the temperature of the electrical wire 52 is 35° C.

In this case, the temperature (40° C.) of the electrical wire 51 estimated by the present temperature estimation unit 115a of the control logic 11a is higher than the temperature (35° C.) of the electrical wire 52 estimated by the present temperature estimation unit 115a of the control logic 11b.

Therefore, in order for the present temperature estimation unit 115a of the control logic 11b to estimate the same temperature as the temperature (35° C.) of the electrical wire 52 estimated by the present temperature estimation unit 115a of the control logic 11b as the temperature of the electrical wire 51, the target duty ratio calculation unit 115b of the control logic 11a calculates the target duty ratio of the driving signal DR1 that the PWM/DC control and shutoff determination unit 112 of the control logic 11a outputs to the output terminal OUT1.

Here, when the effective current of the electrical wire 51 under condition of turning on and off the semiconductor switching device "a" of the IPD 131 by PWM driving with the drive signal DR1 at the target duty ratio coincides with the effective electric current of the electrical wire 52 when PWM-driving the semiconductor switching device "a" at the duty ratio of 50%, the present temperature estimation unit 115a of the control logic 11a will estimate the same temperature as the temperature (35° C.) of the electrical wire 52 as the temperature of the electrical wire 51.

The effective current of the electrical wire 52 when PWM-driving the semiconductor switching device "a" at the duty ratio of 50% becomes a value obtained by an expression of multiplying the passing current of the electrical wire 52 measured by the current measurement unit "b" of the IPD 132 during the on-period of the semiconductor switching device "a" by the square root of the duty ratio (50%), that is, effective current of electrical wire 52=passing current of electrical wire 52 measured by current measurement unit "b" of IPD 132×$(50\%)^{0.5}$=2.5×$(0.5)^{0.5}$, is approximately 1.77.

Further, the effective current of the electrical wire 51 under condition of turning on and off the semiconductor switching device "a" of the IPD 131 by PWM driving with the drive signal DR1 at the target duty ratio is obtained by the following expression, that is, effective current of electrical wire 51=passing current (=3.0 A) of electrical wire 51 measured by current measurement unit "b" of IPD 131×(target duty ratio of the driving signal $DR1)^{0.5}$.

From the above, the following equation is obtained as follow, 1.77=3.0×(target duty ratio of driving signal $DR1)^{0.5}$, then, the target duty ratio of the driving signal DR is as follow, $(1.77/3)^2$=34.81(%).

On the other hand, the target duty ratio calculation unit 115b of the control logic 11b calculates, as the duty ratio of the driving signal DR2 that the PWM/DC control and shutoff determination unit 112 of the control logic 11b outputs to the output terminal OUT2, 50% so that the semiconductor switching device "a" of the IPD 132 continues PWM driving at the duty ratio of 50% and thus, the present temperature estimation unit 115 of the control logic 11b estimates, as the temperature of the electrical wire 52, the same temperature (35° C.) as at present.

The frequencies of the drive signals DR1, DR2 in PWM-driving the semiconductor switching devices "a" of the IPDs 131, 132 can be 100 Hz, for example.

Figure 4:
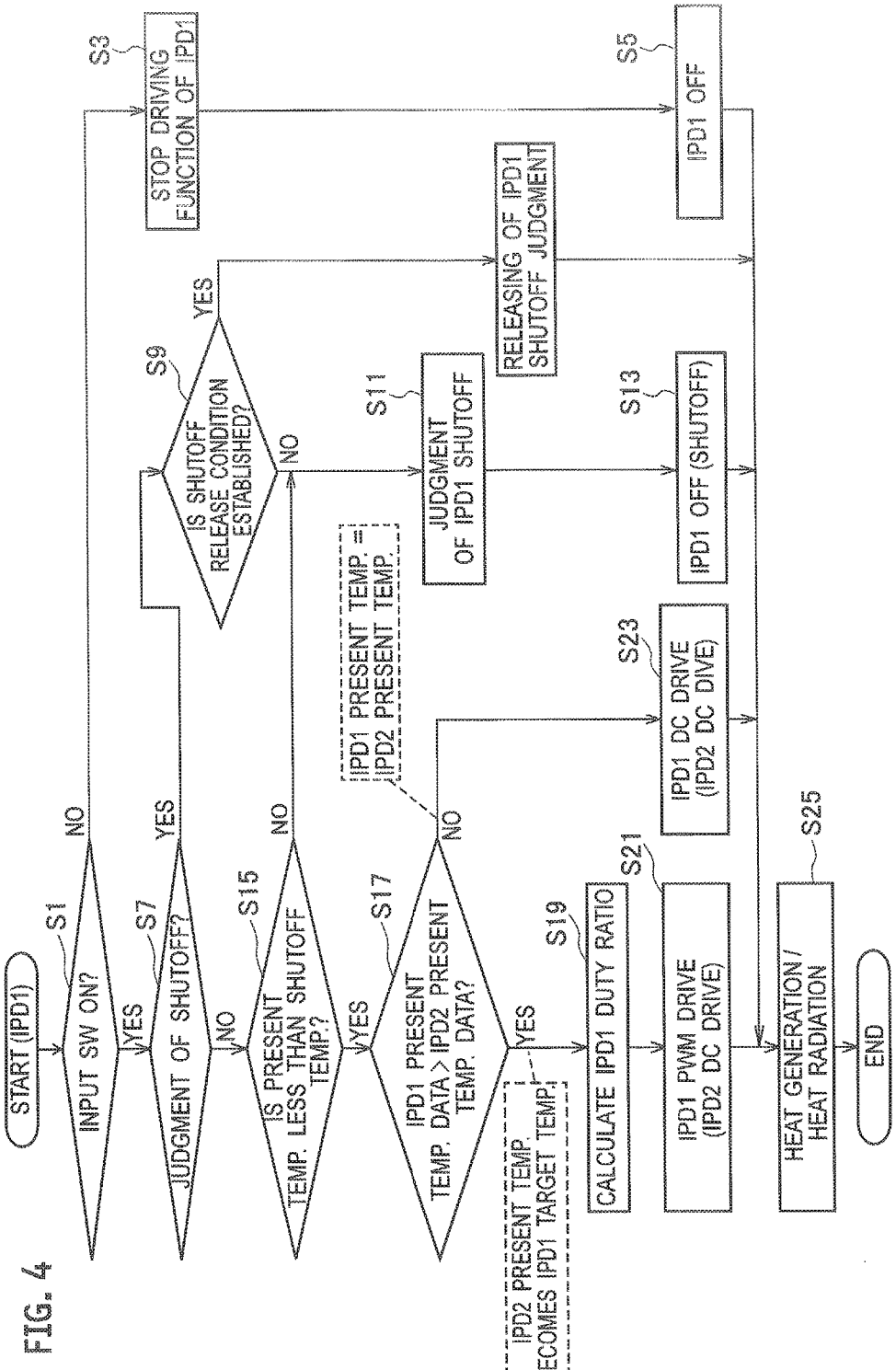
FIG. 4 is a flowchart illustrating an operation performed in the power supply control device of FIG. 1.

Next, as for the operation (action) executed in the above-constructed power supply control device 1, the operation about a process executed by the control logic 11a of the control unit 11 will be selectively described with reference to the flowchart of FIG. 4. In the power supply control device 1, the operation illustrated in the flowchart of FIG. 4 is repeatedly carried out at regular intervals.

First, from the signal level of the switch signal S, it is executed to confirm whether or not the input switch SW is turned on (step S1). When the input switch SW is not turned on (NO at step S1), it is executed to stop the function of controlling supplying the electric power to the load 3 by driving the semiconductor switching device "a" of the IPD 131 (step S3). Then, after the outputting of the driving signal DR1 by the PWM/DC control and shutoff determination unit 112 is stopped to turn off the IPD 131 (step S5), the process goes to step S25 described later.

On the other hand, when the input switch SW is turned on (YES at step S1), the PWM/DC control and shutoff determination unit 112 confirms whether or not the passing current of the electrical wire 51 detected by the electric current detection unit 113 has risen to a current worthy of an overcurrent shutoff (step S7).

When the passing current of the electrical wire 51 has not risen to the current worthy of the overcurrent shutoff and it has not been already judged at the previous step S7 that the passing current of the electrical wire 51 had risen to the current worthy of the overcurrent shutoff (NO at step S7), the process proceeds to step S15 described later.

Alternatively, when the passing current of the electrical wire 51 has risen to the current worthy of the overcurrent shutoff and it has been already judged at the previous step S7 that the passing current of the electrical wire 51 had risen to the current worthy of the overcurrent shutoff (YES at step S7), it is executed to confirm whether or not the condition for releasing the shutoff of the IPD 131 has been established (step S9).

Here, the shutoff releasing condition of the IPD 131 is, for example, that both of the following two conditions are satisfied:

(1) The on-state of the input switch SW continues for a certain period; and (2) The temperature of the electrical wire 51 estimated by the present temperature estimation unit 115a has dropped up to a safe temperature (for example, a surrounding ambient temperature).

When the shutoff releasing condition of the IPD 131 is not established (NO at step S9), it is judged that supplying the electric power to the load 3 by the IPD 131 is shut off (step S11) and the outputting of the driving signal DR1 by the PWM/DC control and shutoff determination unit 112 is stopped to turn off the IPD 131 (step S13). Thereafter, the process goes to step S25.

On the other hand, at step S15 as a destination of the process when it is judged at step S7 that the passing current of the electrical wire 51 has not risen up to the current worthy of the overcurrent shutoff, it is executed in the PWM/DC control and shutoff determination unit 112 to confirm whether or not the temperature of the electrical wire 51 estimated by the present temperature estimation unit 115a is less than a shutoff temperature.

When the temperature of the electrical wire 51 is not less than the shutoff temperature (NO at step S15), it is judged that supplying the electric power to the load 3 by the IPD 131 is shut off (step S11) and the outputting of the driving signal DR1 by the PWM/DC control and shutoff determination unit 112 is stopped to turn off the IPD 131 (step S13). Thereafter, the process goes to step S25.

On the contrary, when the temperature of the electrical wire 51 is less than the shutoff temperature (YES at step S15), it is executed in the PWM/DC control and shutoff determination unit 112 to confirm whether or not the temperature of the electrical wire 51 (the present temperature of the IPD 131) estimated by the present temperature estimation unit 115a of the control logic 11a is higher than the temperature of the electrical wire 52 (the present temperature of the IPD 132) estimated by the present temperature estimation unit 115a of the control logic 11b (step S17).

When the estimated temperature of the electrical wire 51 (the present temperature of the IPD 131) is higher than the estimated temperature of the electrical wire 52 (the present temperature of the IPD 132) (YES at step S17), it executed in the target duty ratio calculation unit 115b to calculate the duty ratio of the driving signal DR1 to be outputted to the semiconductor switching device "a" of the IPD 131 in order to make the estimated temperature of the electrical wire 51 (the present temperature of the IPD 131) coincide with the estimated temperature of the electrical wire 52 (the present temperature of the IPD 132) (step S19).

Then, the driving signal DR1 of the calculated target duty ratio is outputted from the PWM/DC control and shutoff determination unit 112 to the semiconductor switching device "a" of the IPD 131 (step S21) and thereafter, the process goes to step S25.

At step S17, when the estimated temperature of the electrical wire 51 (the present temperature of the IPD 131) is not higher than the estimated temperature of the electrical wire 52 (the present temperature of the IPD 132) (NO), it is recognized that both are the same temperature. Then, the IPD 131 of the electrical wire 51 is driven at the same duty ratio as ever. Assuming here that the IPD 131 of the electrical wire 51 has been DC driven until now, the driving signal DR1 for DC driving the semiconductor switching device "a" is outputted from the PWM/DC control and shutoff determination unit 112 to the semiconductor switching device "a" of the IPD 131 (Step S23). Thereafter, the process goes to step S25.

At step S25, a process of radiating heat generated by the IPD 131 is performed. In this process, it is executed to continue such a condition that the IPD 131 was turned off at step S5 or step S13, for a certain period. Alternatively, it is executed to continue such a condition that the semiconductor switching device "a" of the IPD 131 is PWM-driven or DC-driven by the driving signal DR1 outputted from the PWM/DC control and shutoff determination unit 112 at step S21 or step S23, for a certain period. That is, it is executed, by continuing these states for a certain period, to check whether or not there is produced a change in the heating state (temperature) of the electrical wire 51 due to heat generation of the IPD 131. After a certain period of time has elapsed, a series of processes are ended.

The processing procedures performed by the control logic 11b of the control unit 11 are similar to the above-mentioned procedures except that objects of judgments, operations and controls to be performed at respective steps of the flow chart of FIG. 4 are replaced with the IPD 132, its semiconductor switching device "a", the respective units 111 to 115 in the control logic 11b and the electrical wire 52.

At step S17, it is executed in the PWM/DC control and shutoff determination unit 112 to confirm whether or not the temperature of the electrical wire 52 (the present temperature of the IPD 132) estimated by the present temperature estimation unit 115a of the control logic 11b is higher than the temperature of the electrical wire 51 (the present temperature of the IPD 131) estimated by the present temperature estimation unit 115a of the control logic 11a.

In the power supply control device 1 according to the first embodiment, when the electric power supplied from the power supply B to the load 3 via the parallel circuit 5 of the two electrical wires 51, 52 having the same wiring resistance is shut off by turning off the semiconductor switching devices "a" of the IPDs 131, 132 on the respective electrical wires 51, 52 based on the temperatures of the respective electrical wires 51, 52, it is carried out to measure the passing currents flowing through the semiconductor switching devices "a" on the respective electrical wires 51, 52 by the current measurement units "b" of the IPDs 131, 132 and further estimate the temperatures of the electrical wires 51, 52 from the measured currents by the present temperature estimation units 115.

Then, in order to make the estimated temperatures of the respective electrical wires 51, 52 coincide with each other, the target duty ratio of PWM control for reducing the passing current of the semiconductor switching device "a" of the IPD 131 on the electrical wire 51 is calculated by the target duty ratio calculation unit 115b and additionally, the semiconductor switching device "a" of the IPD 131 is turned on and off at the target duty ratio by the PWM/DC control shutoff determination section 112.

Thus, by PWM-controlling the semiconductor switching device "a" of the IPD 131 at the target duty ratio, the temperatures of the electrical wires 51, 52 estimated from the measured values of the passing currents of the semiconductor switching devices "a" of the respective IPDs 131, 132 become identical to each other, so that the timings at which the semiconductor switching devices "a" are turned off based on the temperatures of the electrical wires 51, 52 coincide with each other.

Therefore, when shutting off the electric power supplied from the power supply B to the load 3 via the parallel circuit 5 of the two electrical wires 51, 52 having the same wiring resistance by turning off the semiconductor switching devices "a" on the respective electrical wires 51, 52 based on the temperatures of the respective electrical wires 51, 52, the shutoff timings of supplying the electric power by the respective semiconductor switching devices "a" could be synchronized with each other even when individual variations, differences in installation environment, or the like occur between the respective electrical wires 51, 52 or the respective semiconductor switching devices "a".

Consequently, even after supplying the electric power to the load 3 is shut off since the semiconductor switching device "a" is turned off in one IPD 131 (or 132), it is possible to prevent the occurrence of such a situation that supplying the electric power to the load 3 is still maintained since the semiconductor switching device "a" remains turned on in the other IPD 132 (or 131) thereby causing the occurrence of an anomaly heat generation or deterioration in resistance by the resultant concentration of current on the IPD 132 (or 131).

In the first embodiment, the parallel circuit 5 for supplying the load 3 with the electric power from the power supply B is composed of two electrical wires 51, 52 interposing the IPDs 131 and 132 respectively. Nevertheless, the present application is also applicable to a parallel circuit composed of three or more electrical wires (51, 52, 53, . . . ) interposing IPDs (131, 132, 133, . . . ) respectively.

In the first embodiment, additionally, when there is a difference in the temperature of each electrical wire estimated from the temperature measured by the current measurement unit of the IPD of each electrical wire, it is executed to make the temperature of one electrical wire having a higher temperature coincide with the temperature of the other electrical wire having a lower temperature. However, the temperature of one electrical wire having a lower temperature may be matched to the temperature of the other electrical wire having a higher temperature. In case of three or more electrical wires, alternatively, the temperatures of other electrical wires may be matched to an intermediate temperature.

Then, as in the first embodiment, when only making the estimated temperature of the other electrical wire 51 coincide with the lowest estimated temperature of all the electrical wires 51, 52, the temperatures of all the electrical wires 51, 52 can be shifted in a direction to lower decrease their temperatures, thereby allowing the respective electrical wires 51, 52 of the parallel circuit 5 to be controlled to an appropriate temperature.

Further, although the first embodiment has been described in the arrangement where the wiring resistances of the electrical wires 51, 52 are equal to each other, the present application is also applicable to an arrangement where the wiring resistances of the respective electrical wires 51, 52 are different from each other.

Although the IPDs 131, 132 are employed in the first embodiment, the present application is also applicable to an arrangement where supplying the electric power to the load 3 is controlled with the use of semiconductor switching devices other than the IPD 131, 132, for example, power semiconductor switches.

Second Embodiment

A disconnection detecting device as the vehicular power supply control device according to a second embodiment will be described with reference to FIGS. 5 to 12.
(Re. Functional Constitution of Disconnection Detection Device)
FIG. 5 is a functional constitution diagram of a disconnection detecting device 10 as the vehicular power supply control device according to the second embodiment.

Figure 5:
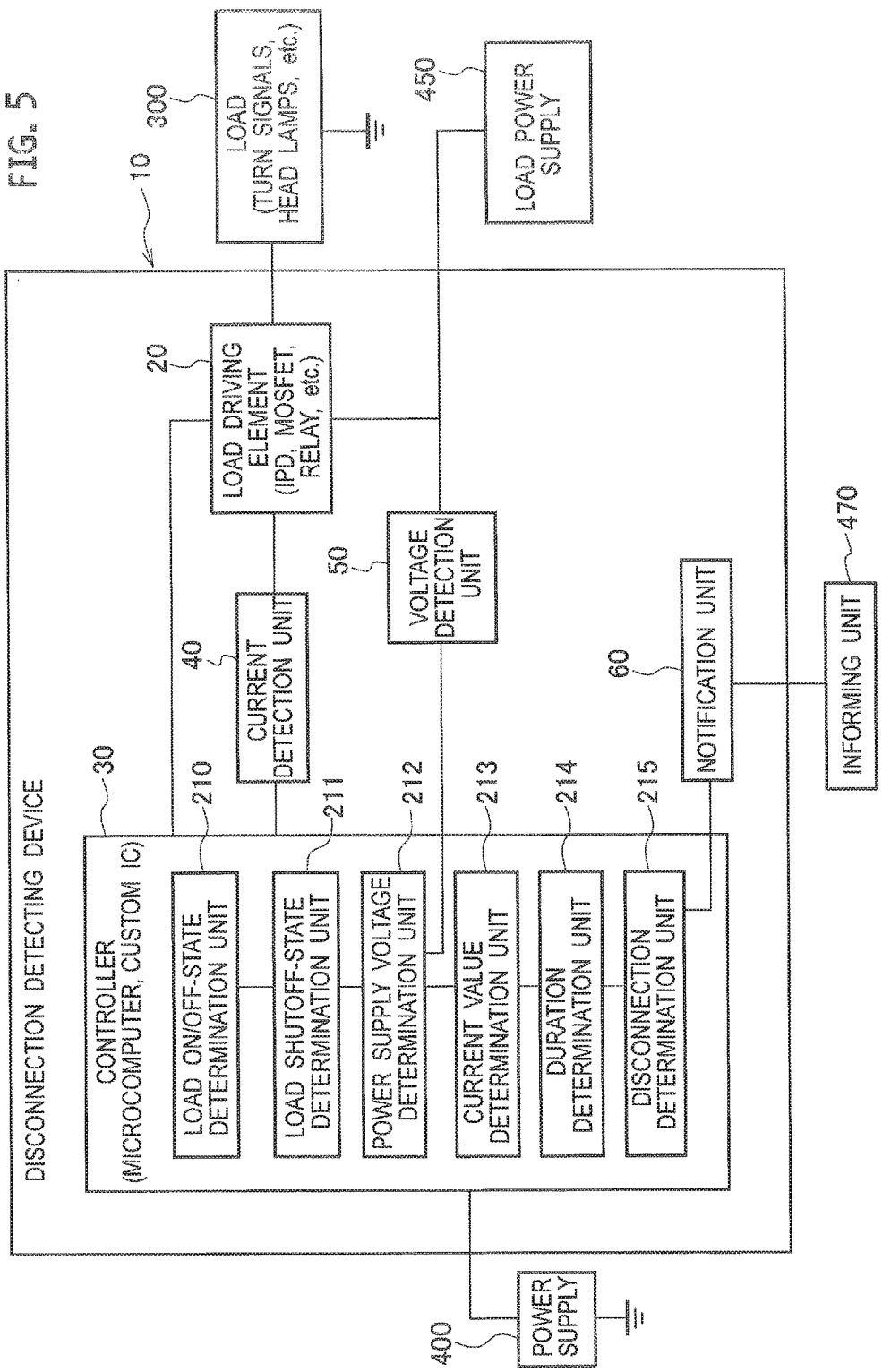
FIG. 5 is a functional constitution diagram of a disconnection detecting device according to a second embodiment.

As illustrated in FIG. 5, the disconnection detecting device 10 according to the second embodiment includes a load driving device 20 including an IPD (Intelligent Power Device), a MOSFET, a relays, or the like to drive a load 300, such as turn signal lamps or head lamps for a vehicle, a controller 30 including a microcomputer, a custom IC, or the like, to control the operation of the load driving device 20, and a current detection unit 40 arranged between the load driving device 20 and the controller 30 to detect a current flowing through the load driving device 20.

Besides, when an IPD is employed as the load driving device 20, the current detection unit 40 can be incorporated in the form of an integrated circuit. That is, the IPD is an integrated circuit for a power supply, in which a switching device and its driving circuit are functionally integrated and highly functionalized. Thus, the IPD adapted as the load driving device 20 of the disconnection detecting device 10 according to the second embodiment can include a function of detecting a current value of a load current. The current detection unit 40 can be constituted by e.g. a current detection circuit including a shunt resistor or the like.

Further, the controller 30 is connected to a voltage detection unit 50 for detecting a voltage (power supply voltage) of a load power supply 450 (for example, an in-vehicle battery generating a voltage of 12 V). An example structure of the voltage detection unit 50 will be described later.

In the second embodiment, the controller 30 includes: a load on/off-state determination unit 210 for determining whether the load 300 is in an on-state or an off-state; a load shutoff-state determination unit 211 that determines whether or not the shutoff state of the load 3 comes from an overcurrent based on the detection result of the current detection unit 40 when the load on/off-state determination unit 210 determines that the load 300 is in the on-state; a power supply voltage determination unit 212 that determines whether or not the power supply voltage detected by the voltage detection unit 5 is less than a predetermined voltage value (for example, 6 V) when the load shutoff-state determination unit 211 determines that the load 3 is not in the shutoff state; a current value determination unit 213 that determines whether or not the current value detected by the current detection unit 40 is less than a predetermined threshold value when the power supply voltage determination unit 212 determines that the power supply voltage is not less than the predetermined voltage value; a duration determination unit 214 which judges whether or not the duration of a state where the current value is less than the threshold value has reached a predetermined hold time when the current value determination unit 213 determines that the current value is less than the threshold value; and a disconnection determination unit 215 that determines the occurrence of a disconnection in either the load 300 or a load circuit including the load driving device 20 when the duration determination unit 214 judges that the duration has reached the hold time.

Each of the above-described determination units is actually composed of a program executable by a microcomputer or the constituting the controller 30.

Furthermore, the disconnection detecting device 10 further includes a notification unit 60 that notifies such as an external informing unit 470 of the occurrence of a disconnection when the disconnection determination unit 215 determines that a disconnection has occurred. Consequently, as the occurrence of a disconnection can be notified through an indicator or the like, a vehicle driver or the like can repair the load and replace components in a timely manner.

Then, by providing the above-described load on/off-state determination unit 210, it is possible to exclude such a situation that the load 300 is in the off-state from a target of disconnection detection.

Additionally, by providing the load shutoff-state determination unit 211, it is possible to exclude such a situation that the load 300 is in the shutoff state due to an overcurrent from a target of disconnection detection.

For instance, when constructing the load driving device 20 by an IPD, whether or not the load 300 is in the shutoff state due to an overcurrent can be determined by using the current detecting function possessed by this IPD. More specifically, the IPD first detects the current value of the load 300 by the electric power supplied from an in-vehicle battery as the load power supply 450. The detected current value is outputted to a microcomputer or the like constituting the controller 30. In the controller 30, as long as it is ordinary operated, it is executed to monitor the inputted current of the load 300 and also judge whether or not an overcurrent condition, such as a complete short circuit or a local short circuit exceeding a predetermined integration time has occurred. While judging that the overcurrent condition has occurred, the controller 30 controls the IPD so as to stop supplying the electric power to the load 300, thereby realizing the shutoff state.

Thus, by excluding such a situation that the load 300 is in the shutoff state due to an overcurrent from a target of disconnection detection, it is possible to avoid an event of erroneously detecting, as the disconnection state, such a situation that the load 300 is in the shutoff state, thereby allowing the accuracy of detecting a disconnection to be improved.

A variation in the power supply voltage may affect the current value. For this reason, by providing the power supply voltage determination unit 212, it is possible to suspend the judgment of a disconnection detection even under a situation that, for example, the power supply voltage (ordinary outputting 12 V) of the in-vehicle battery as the load power supply 450 becomes less than the rated voltage (e.g. less than 6 V) due to wastage or the like.

Consequently, it is possible to avoid an event of erroneously detecting, as the disconnection state, such a situation that the power supply voltage of the in-vehicle battery is lowered, thereby allowing the accuracy of detecting a disconnection to be improved furthermore.

In this way, by targeting of disconnection detection at the situation that the load 300 is being ordinary operated in the on-state as a result of receiving the judgments of the load on/off-state determination unit 210, the load shutoff-state determination unit 211, and the power supply voltage determination unit 212, it is possible to improve the accuracy of the disconnection detection.

As there is a possibility of erroneous detection in disconnection detection when the load 300 is turned on and off on the downstream side, such a situation may be excluded from the determination target of disconnection detection. Further, the controller 30 may receive a multiplex or local signal representing driving state of the load 300 from such as an ECU (Electronic Control Unit) for controlling the load 300.

Owing to the provision of the duration determination unit 214, it is judged whether or not the duration of a state where the current value is less than the threshold value has reached the predetermined hold time. That is, in consideration of the case that the load 300 is driven by PWM (Pulse Width Modulation) or intermittently, it is possible to suspend the judgment of disconnection detection until such a situation that the current value is less than the threshold continues for the predetermined holding time.

Thus, even when the load 300 is driven by PWM or intermittently, it is possible to detect the disconnection state with high accuracy.

Note that, for example, when the load 300 is driven by PWM, the holding time can be set to be equal or longer than an off-time of a predetermined pulse wave. Further, when the duty ratio of the pulse wave is made variable, the holding time may be altered accordingly. Alternatively, the holding time may be matched with the longest off-time of the pulse wave.

As for the method of notifying the occurrence of a disconnection to the outside by the notification unit 60, for example, it is possible to transmit the occurrence of a disconnection in the form of a multiplex signal to the other ECU. Alternatively, it is possible to light up an indicator or the like as a kind of the informing unit 470.

Further, the current threshold value in the current value determination unit 213 may be set with respect to each of the multiple loads 300 including turn signals, head lamps, and the like. Alternatively, a common threshold value may be applied to the respective loads 300.

The data about the threshold value may be stored in a storage unit of such as a microcomputer constituting the controller 30 or stored in a nonvolatile memory or the like accessible by such as a microcomputer.

Besides, the processing procedures of the disconnection detection process by the respective determination units will be described later.

(Re. Constitution Example of Disconnection Detection Device)

Figure 6:
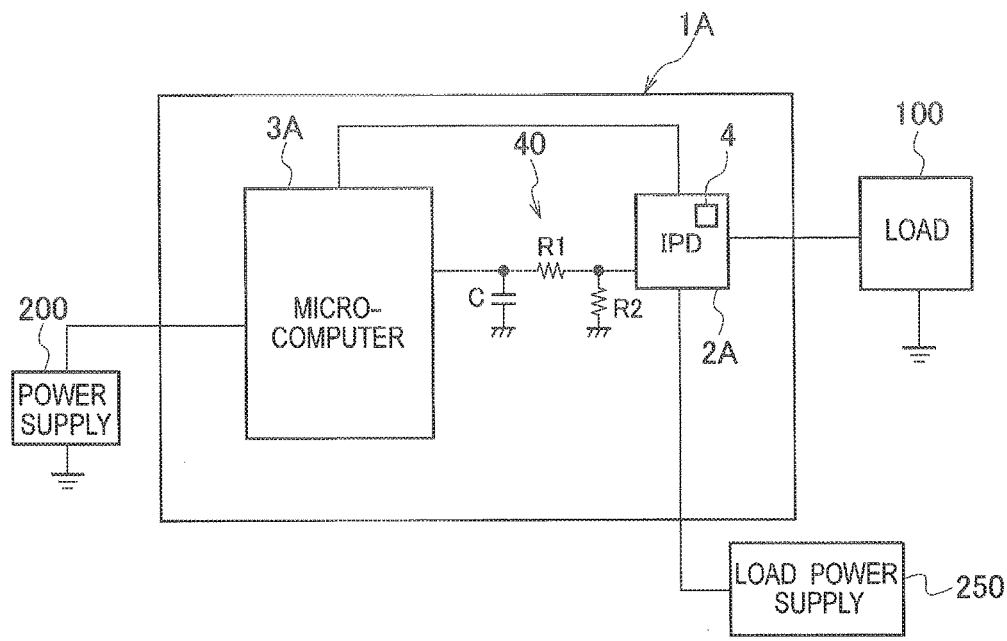
FIG. 6 is a schematic constitution diagram of the disconnection detecting device according to the second embodiment.

FIG. 6 is a schematic constitution diagram of the disconnection detecting device 10 according to the second embodiment.

In the disconnection detecting device 1A illustrated in FIG. 6, an IPD is used as the load driving device 2A and a microcomputer is applied as the controller 3A. The load power supply 250 (e.g. an in-vehicle battery outputting 12 V, etc.) is connected to the IPD. Additionally, a power supply 200 that converts electric power supplied from e.g. the vehicle battery or the like to 5 V is connected to the controller (microcomputer) 3A.

In the disconnection detecting device 1A illustrated in FIG. 6, the current detection unit 4 includes a current detection circuit or the like equipped with e.g. a shunt resistance.

In connection, a circuit designated with reference numeral 40 is a voltage dividing circuit including resistors R 1, R 2 and a smoothing capacitor C.

Here, the voltage dividing circuit 40 is adapted so as to convert a current value supplied from the load driving device 2A into a voltage value by the resistor R1, remove noise by the resistor R2 and the smoothing capacitor C and subsequently input the voltage value in analog to the controller (microcomputer) 3A.

Figure 7:
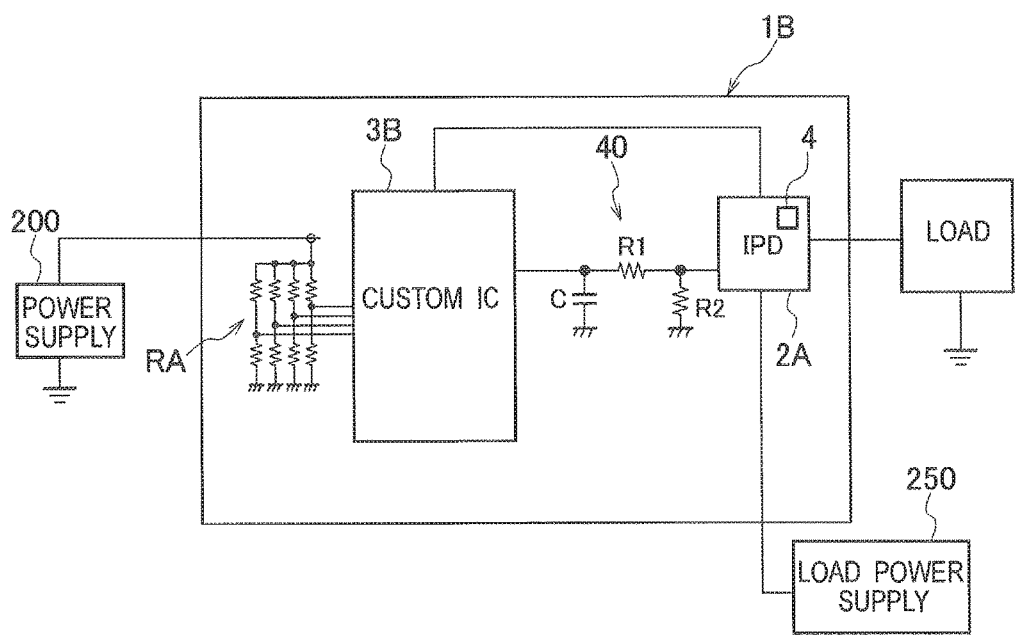
FIG. 7 is a schematic constitution diagram of a disconnection detecting device according to a modification of the second embodiment.

FIG. 7 is schematic constitution diagram of a disconnection detecting device 1B according to a modification of the second embodiment.

In the disconnection detecting device 1B, an IPD is used as the load driving device 2A and a custom IC is applied as the controller 3B. Note, the constitution of the current detection unit 40 is similar to that of FIG. 6. A load power supply 250 (e.g. an in-vehicle battery outputting 12 V, etc.) is connected to the IPD.

In the constitution where the custom IC is applied as the controller 30 as in the disconnection detecting device 1B, the above-mentioned current threshold value may be replaced by a voltage value related to resistance ratio of a resistance group RA connected to the custom IC.

Figure 8A:
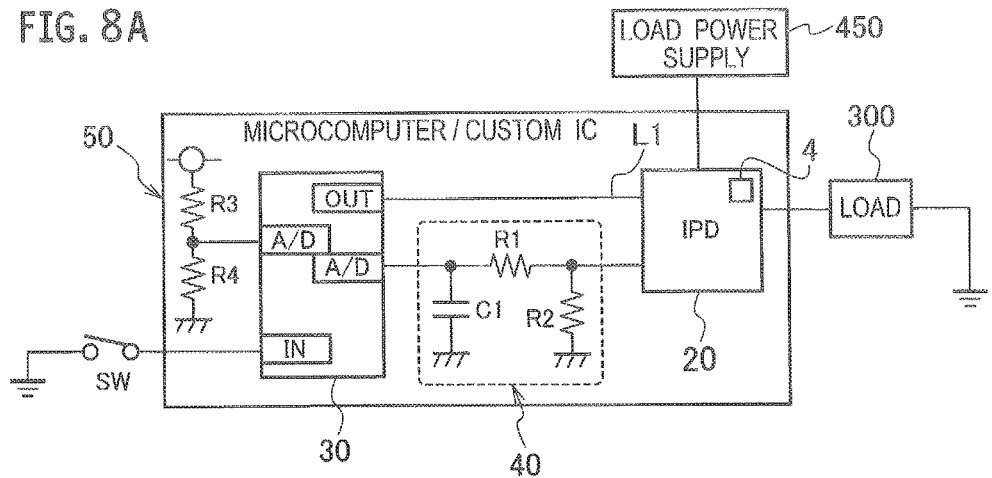
FIG. 8A is a diagram illustrating a constitution example using an IPD as a load driving device in the disconnection detecting device according to the second embodiment.
Figure 8B:
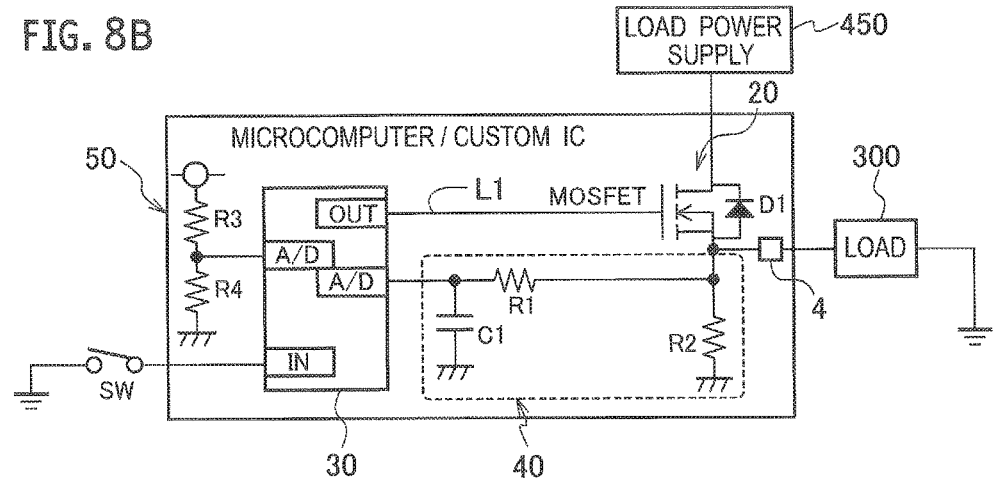
FIG. 8B is a diagram illustrating a constitution example using a MOSFET as the load driving device in the disconnection detecting device according to the second embodiment.
Figure 8C:
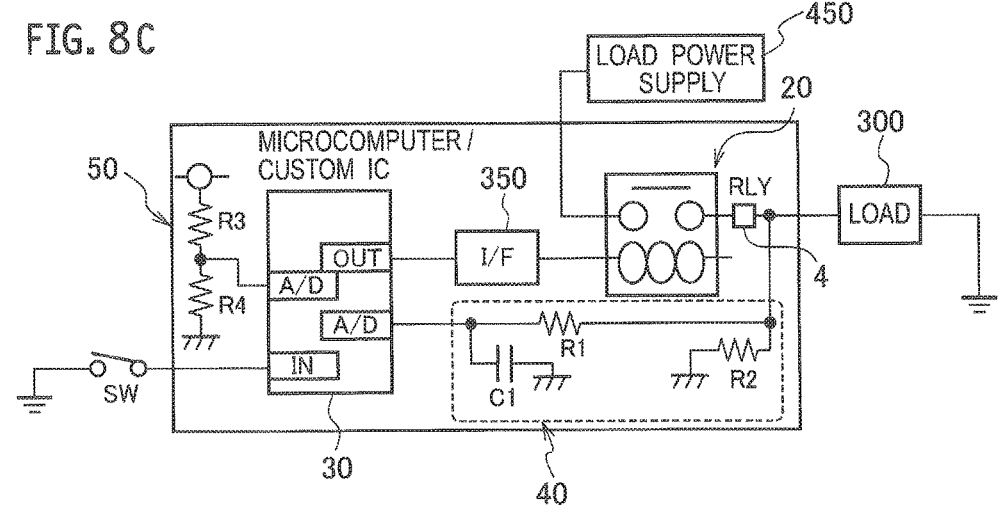
FIG. 8C is a diagram illustrating a constitution example using a relay as the load drive device in the disconnection detecting device according to the second embodiment.

FIGS. 8A to 8C are constitution diagrams illustrating aspects of the load drive device in the disconnection detecting device according to the second embodiment.

FIG. 8A illustrates a constitution example using an IPD as the load driving device 20. The constitution of the current detection unit 40 is similar to that of FIG. 6 described above. The load power supply 450 (e.g. an in-vehicle battery outputting 12 V, etc.) is connected to the IPD.

The voltage detection unit 50 is composed of a voltage dividing circuit including resistors R3, R4 and also adapted so that its output is inputted to an A/D (analog-to-digital conversion) terminal of the controller 30 including a microcomputer (or a custom IC).

Further, an input (IN) terminal of the controller 30 is connected to a ground potential via a switch SW. The output from the current detection unit 4 is inputted to the A/D (analog-digital conversion) terminal of the controller 30 via the voltage dividing circuit 40. In addition, a control signal output from the output (OUT) terminal of the controller 30 is input to the IPD via the wiring L1.

FIG. 8B illustrates a constitution example using a MOSFET and a diode D1 as the load driving device 20. Note, the constitution of the current detection unit 4 is similar to that of FIG. 6 described above. The load power supply 450 (e.g. an in-vehicle battery outputting 12 V, etc.) is connected to a drain electrode of the MOSFET. The load 300 is connected to a source electrode of the MOSFET.

The voltage detection unit 50 is composed of a voltage dividing circuit including resistors R3, R4 and also adapted so that its output is inputted to an A/D (analog-to-digital conversion) terminal of the controller 30 including a microcomputer (or a custom IC). an input (IN) terminal of the controller 30 is connected to a ground potential via a switch SW. The output from the current detection unit 4 is inputted to the A/D (analog-digital conversion) terminal of the controller 30 via the voltage dividing circuit 40.

Additionally, a control signal outputted from an output (OUT) terminal of the controller 30 is inputted to a gate terminal of the MOSFET via a wiring L1.

FIG. 8C illustrates a constitution example using a relay (RLY) as the load driving device 20. The constitution of the current detection unit 4 is similar to that of FIG. 6 described above.

The load power supply 450 (e.g. an in-vehicle battery outputting 12V, etc.) is connected to an input electrode of the relay (RLY). The load 300 is connected to an output electrode of the relay (RLY).

The voltage detection unit 50 is composed of a voltage dividing circuit including resistors R3, R4 and also adapted so that its output is inputted to an A/D (analog-to-digital conversion) terminal of the controller 30 including a microcomputer (or a custom IC). An input (IN) terminal of the controller 30 is connected to a ground potential via a switch SW. The output from the current detection unit 40 is inputted to the A/D (analog-digital conversion) terminal of the controller 30 via the voltage dividing circuit 240.

Additionally, a control signal outputted from an output (OUT) terminal of the controller 30 is inputted to a solenoid terminal of the relay (RLY) via an interface (I/F).

The relay (RLY) may include a semiconductor relay.

(Load Processing)

With reference to the flowchart illustrated in FIG. 9, an example of the processing procedures of the load processing about the load 300 executed by the disconnection detecting device 10 according to the second embodiment will be described. This processing is executed by a microcomputer or the like constituting the controller 30 based on a predetermined program (software).

When the load processing is started, subroutines of application processing for executing predetermined application software are executed at steps S31, S32. As the application processing, there can be cited an operation testing of the load 300, for example.

At step S33, the subroutine of detecting an overcurrent is executed. Although a detailed processing procedure will be omitted, there is performed, for example, a process of determining whether or not the current had exceeded a predetermined current value based on a detection result of the current detection unit 4.

Then, when it is determined in the overcurrent detection process that no overcurrent is detected, the process goes to step S34 where the subroutine of detecting a disconnection is executed and thereafter, the process is ended.

(Disconnection Detecting Process)

The processing procedure of the subroutine of detecting an overcurrent at step S34 in the load processing will be described with reference to FIGS. 10 and 11A to 11E.

At step S41, a load on/off-state determination process is executed to judge whether the load 300 driven by the load driving device 20 is in the on-state or the off-state.

When the judgment result is "No", that is, in a case that the load 300 is in the off-state (a case that the input signal is "OFF" in FIG. 11A), the process is ended. While, when the judgment result is "Yes", that is, when the load 300 is in the on-state (a case that the input signal is "ON" in FIG. 11A), the process proceeds to step S42.

Based on the detection result of the current detection unit 4, at step S42, a load shutoff-state determination process is executed to judge whether or not the load 300 is in a shutoff-state due to an overcurrent.

When the judgment result is "Yes", that is, when the load 300 is being shut off (case of "off" in FIG. 11B), the process is ended. While, in case of "No", the process goes to step S43.

At step S43, a power supply voltage determination process is executed to judge whether or not the power supply voltage is less than a predetermined voltage value.

Then, when the judgment result is "Yes", that is, when the power supply voltage is less than the predetermined voltage value, the process is ended. While, in case of "No", the process goes to step S44.

At step S44, a current value determination process is executed to judge whether or not the current value detected by the current detection unit 4 for detecting the current flowing through the load driving device 20 is less than a preset threshold value.

When the judgment result is "No", that is, when the current value is not less than the preset threshold value (case of the ordinary state in FIG. 11D, the process is ended. While, in case of "Yes", that is, when the current value is less than the preset threshold value (a case of the disconnection state in FIG. 11D), the process goes to step S45.

At step S45, a duration determination process is executed to judge whether or not the duration of the state where the current value is less than the threshold had reached a predetermined hold time (Twait).

Then, when the judgment result is "No", that is, in a case that the duration time has not reached the predetermined hold time (Twait), the process returns to step S41 to continue the same processing. On the other hand, when the judgment result is "Yes", that is, in a case that the duration has reached the predetermined hold time (Twait), the process goes to step S46.

When it is judged in the duration determination process that the duration time has reached the hold time (Twait) (case of FIG. 11E), a disconnection determination process is executed at step S46 to judge that a disconnection has occurred in either the load 300 or the load circuit including the load driving device 20. Upon judgement of the occurrence of a disconnection, the occurrence of the disconnection is notified to an outside (the informing unit 470 or the like). Then, the process returns to the main process of FIG. 9, and thereafter, the main process is ended.

As described above, with the disconnection detecting device 10 and the disconnection detecting method according to the second embodiment, since such as the controller for detecting the overcurrent state can be diverted as it is, it is possible to detect a disconnection relatively simply and at a low cost without using a detection circuit exclusive to detect a disconnection or a complicated logic circuit.

Further, even when there arises a change in voltage or a load, the range of the detectable current value could be appropriately modified by correcting programs or data.

Although the vehicular power supply control device according to the second embodiment has been described with reference to FIGS. 5 to 11, the present application is not limited to this configuration, and the constitution of each unit may be replaced with an arbitrary constitution having the similar function.

For example, as illustrated in FIG. 12, the threshold value about the current value may be acquired from an external ECU 500 via an in-vehicle LAN. Additionally, the information about a disconnection may be transmitted to the ECU 500 via the in-vehicle LAN.

Figure 9:
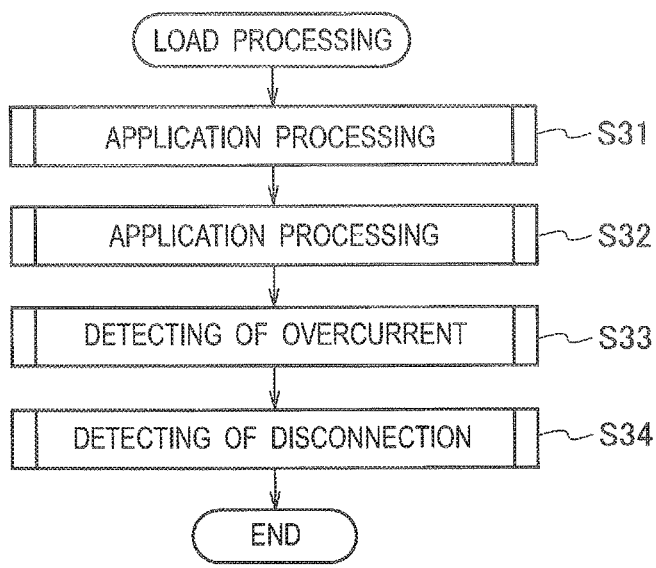
FIG. 9 is a flowchart illustrating an example of a processing procedure of a load processing executed by a microcomputer of the disconnection detecting device according to the second embodiment.
Figure 10:
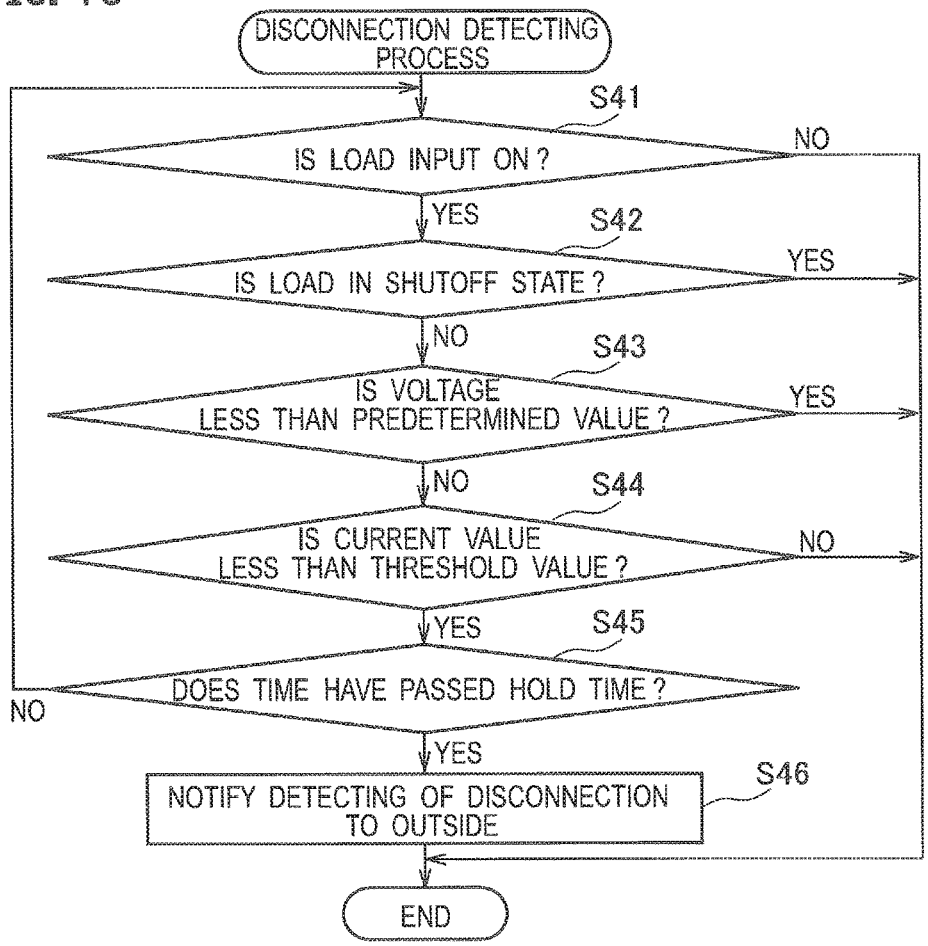
FIG. 10 is a flowchart illustrating an example of a processing procedure of a subroutine of a disconnection detection process executed by the microcomputer of the disconnection detecting device according to a second embodiment.

In addition, the current value may be acquired by the current detection unit 4 at the timing of executing the overcurrent detection process (step S33) in the flowchart of FIG. 9.

What is claimed is:

1. A vehicular power supply control device for shutting off DC electric power to be supplied from a vehicular DC power supply to a load via a parallel circuit of a plurality of electrical wires by turning off respective semiconductor switching devices on the electrical wires based on respective temperatures of the electrical wires, comprising:
    a current measurement unit configured to measure passing currents each flowing through each of the semiconductor switching devices;
    a wire temperature estimation unit configured to estimate a temperature of each of the electrical wires from the passing currents;
    a duty ratio determination unit configured to determine a duty ratio of PWM control of each of the semiconductor switching devices for which respective estimated temperatures for each of the electrical wires are matched; and
    a PWM control unit configured to PWM-control each of the semiconductor switching devices with the determined duty ratio of the PWM control of each of the semiconductor switching devices to match one of a minimum and an intermediate one of the estimated temperatures for each of the electrical wires.

2. The vehicular power supply control device of claim 1, wherein the duty ratio determination unit is configured to determine the duty ratio of PWM control of each of the semiconductor switching devices so as to make the estimated temperature of each of the electrical wires coincide with the minimum of the estimated temperatures.

3. The vehicular power supply control device of claim 1, wherein in order to make the estimated temperatures of the respective electrical wires coincide with each other, the target duty ratio of PWM control for reducing the passing current of the semiconductor switching device on one of the electrical wires is calculated by the duty ratio determination unit, and the semiconductor switching device on one of the electrical wires is turned on and off at the target duty ratio by the PWM control unit.

4. The vehicular power supply control device of claim 1, wherein the duty ratio determination unit is configured to determine the duty ratio of PWM control of each of the semiconductor switching devices so as to make the estimated temperature of one of the electrical wires coincide with the estimated temperature of the other of the electric wires.

5. The vehicular power supply control device of claim 1, wherein the electrical wires includes three or more electrical wires, and the duty ratio determination unit is configured to determine the duty ratio of PWM control of each of the semiconductor switching devices so as to make the estimated temperature of each of the electrical wires coincide with the intermediate temperature of the estimated temperatures.

6. The vehicular power supply control device of claim 1, wherein current measurement unit includes a current detection circuit including a shunt resistor.

7. A control method of a vehicular power supply control device that shuts off DC electric power to be supplied from a vehicular DC power supply to a load via a parallel circuit of a plurality of electrical wires by turning off respective semiconductor switching devices on the electrical wires based on respective temperatures of the electrical wires, the control method comprising:

measuring passing currents each flowing through each of the semiconductor switching devices using a current measurement unit;

estimating a temperature of each of the electrical wires from the passing currents by a wire temperature estimation unit;

determining a duty ratio of PWM control of each of the semiconductor switching devices for which respective estimated temperatures for each of the electrical wires are matched, using a duty ratio determination unit; and PWM-controlling each of the semiconductor switching devices with the determined duty ratio of the PWM control of each of the semiconductor switching devices to match one of a minimum and an intermediate one of the estimated temperatures for each of the electrical wires by the duty ratio determination unit using a PWM control unit.

* * * * *